United States Patent
Ishikawa et al.

(10) Patent No.: US 10,775,692 B2
(45) Date of Patent: Sep. 15, 2020

(54) METHOD FOR MANUFACTURING MULTILAYER FILM-DEPOSITED SUBSTRATE AND MULTILAYER FILM-DEPOSITED SUBSTRATE

(71) Applicant: AGC Inc., Chiyoda-ku (JP)

(72) Inventors: Yunosuke Ishikawa, Tokyo (JP); Masaki Mikami, Tokyo (JP); Makoto Kurumisawa, Tokyo (JP)

(73) Assignee: AGC Inc., Chiyoda-ku (JP)

( * ) Notice: Subject to any disclaimer, the term of this patent is extended or adjusted under 35 U.S.C. 154(b) by 62 days.

(21) Appl. No.: 15/667,229

(22) Filed: Aug. 2, 2017

(65) Prior Publication Data

US 2018/0059530 A1 Mar. 1, 2018

(30) Foreign Application Priority Data

Aug. 29, 2016 (JP) .................................. 2016-166751

(51) Int. Cl.
*G03F 1/24* (2012.01)
*G02B 5/08* (2006.01)

(52) U.S. Cl.
CPC .............. *G03F 1/24* (2013.01); *G02B 5/0875* (2013.01); *G02B 5/0891* (2013.01)

(58) Field of Classification Search
CPC ....................................................... G03F 1/24
See application file for complete search history.

(56) References Cited

U.S. PATENT DOCUMENTS

2016/0181134 A1* 6/2016 Budiarto ................. H01L 22/12
438/7

FOREIGN PATENT DOCUMENTS

| JP | 2003-505876 A | 2/2003 |
| JP | 2007-329368 A | 12/2007 |
| JP | 2014-130976 | 7/2014 |
| JP | 2014-130977 | 7/2014 |
| JP | 2016-139675 | 8/2016 |

* cited by examiner

*Primary Examiner* — Alex A Rolland
(74) *Attorney, Agent, or Firm* — Oblon, McClelland, Maier & Neustadt, L.L.P.

(57) ABSTRACT

A method for manufacturing a multilayer film-deposited substrate includes stacking a plurality of lamination units on the substrate while rotating the substrate around a rotational axis perpendicular to a substrate surface. Each of the lamination units has a plurality of layers formed by a dry deposition process. When a plurality of the multilayer film-deposited substrates are manufactured by the dry deposition process, a deposition is performed in a condition satisfying at least one of the following requirements (1) and (2), with estimating a change with time in a deposition rate: $[T_{depo\text{-}unit}/T_r<(m-0.02)$ or $(m+0.02)<T_{depo\text{-}unit}/T_r]$ (1), and $[(n-0.02) \leq T_i/T_r \leq (n+0.02)]$ (2). m and n are independently any integer. $T_i$ is a time interval between the depositions among each layer of the plurality of layers. $T_{depo\text{-}unit}$ is a deposition unit time required for depositing the one lamination unit. $T_r$ is a rotation period of the substrate.

11 Claims, 2 Drawing Sheets

METHOD FOR MANUFACTURING MULTILAYER FILM-DEPOSITED SUBSTRATE AND MULTILAYER FILM-DEPOSITED SUBSTRATE

TECHNICAL FIELD

The present invention relates to a multilayer film-deposited substrate and a method for manufacturing the same. More particularly it relates to a multilayer film-deposited substrate and a method for manufacturing the same, the multilayer film-deposited substrate having a structure in which a plurality of lamination units are stacked, in which each of the lamination units has a plurality of layers.

The multilayer film-deposited substrate according to the present invention is suitable for a multilayer film-deposited substrate for applications required severely as to in-plane uniformity of film thickness. An example of such a multilayer film-deposited substrate may include a multilayer reflective film-deposited substrate for use in manufacturing of a reflective type mask for use in a lithographic process using a reflective optical system, for example, a reflective type mask for EUV (Extreme Ultraviolet) lithography.

BACKGROUND ART

In the semiconductor industry, a photolithographic method using visible light or ultraviolet light has been used as a technique for transferring, to a silicon substrate or the like, a fine pattern required for forming an integrated circuit consisting of the fine pattern. However, with accelerated miniaturization of semiconductor devices, the conventional photolithographic method has approached its limit. In the photolithographic method, a resolution limit of a pattern is about ½ of an exposure wavelength, and is said to be about ¼ of the exposure wavelength even by use of an immersion method. Even when an immersion method with an ArF laser (wavelength: 193 nm) is used, it is estimated that the limit of the resolution limit is about 45 nm. Then, as a next-generation exposure technique using a shorter resolution limit than 45 nm, EUV lithography is regarded as promising, which is an exposure technique using EUV light having a further shorter wavelength than the ArF laser. In the present specification, the EUV light indicates rays whose wavelength is in a soft X-ray region or a vacuum ultraviolet region, and specifically it indicates light rays whose wavelength is about 10 to 20 nm, particularly about 13.5 nm±0.3 nm (13.2 to 13.8 nm).

The EUV light is easily absorbed by any substance, and, in its wavelength, the refractive index of the substance is close to 1. Therefore, a refractive optical system such as a conventional lithography using visible light or ultraviolet light cannot be used. In the EUV lithography, therefore, a reflective optical system, that is, a reflective type photomask and a mirror are used.

A mask blank is a laminate before patterning, which is used for manufacturing a photomask. A mask blank for EUVL (EUV Lithography) has a structure in which a reflective layer that reflects EUV light and an absorption layer that absorbs the EUV light have been formed in this order on a substrate made of glass or the like.

A protective layer is typically formed between the reflective layer and the absorption layer. The protective layer is provided for the purpose of protecting the reflective layer so that the reflective layer can be prevented from being damaged by an etching process performed for the purpose of pattern forming on the absorption layer.

As the reflective layer, a multilayer reflective layer is typically used, in which low refractive layers having a low refractive index to the EUV light and high refractive layers having a high refractive index to the EUV light are disposed alternately to enhance the reflectivity when the surface thereof is irradiated with the EUV light. An example of such a multilayer reflective film may include a Mo/Si multilayer reflective film in which a plurality of bilayers each composed of a molybdenum (Mo) layer as the low refractive layer and a silicon (Si) layer as the high refractive layer have been disposed.

A material having a high absorption coefficient to the EUV light, such as a material containing chrome (Cr) or tantalum (Ta) as a main component, is used in the absorption layer.

In recent years, as optical specifications of a mask blank for EUVL, it has been increasingly required not only to have a high reflectivity but also to have a small in-plane distribution of a centroid wavelength (e.g. 13.5 nm) of reflected light in an EUV wavelength region. For example, it is highly likely that the in-plane distribution of the centroid wavelength will be required to satisfy 0.03 nm or less in the future. A high in-plane uniformity in the film thickness of a multilayer reflective film is required so that the in-plane distribution of the centroid wavelength can satisfy 0.03 nm or less.

Accordingly, the recent mask blank for EUVL has been required not only to have a high reflectivity but also to have the in-plane uniformity (small in-plane distribution) in the film thickness of the multilayer reflective film affecting the in-plane distribution characteristic of the centroid wavelength.

The in-plane distribution is an index of the largeness, and in the present specification, various in-plane distributions have the lower limit value of 0, unless otherwise specified.

Patent Literatures 1 and 2 propose, as one of factors that lower the in-plane uniformity in the film thickness of the multilayer reflective film, an in-plane film thickness distribution of a multilayer reflective film caused by an azimuth deviation in rotation of a substrate between at the start of deposition of low refractive layers and high refractive layers and at the end of the deposition thereof.

An object of Patent Literature 1 is to suppress the in-plane film thickness distribution of a multilayer reflective film caused by an azimuth deviation in rotation of a substrate between at the start of deposition of low refractive layers and high refractive layers and at the end of the deposition thereof. In order to attain the object, according to Patent Literature 1, a change with time in a deposition rate is estimated for each of low refractive layers and high refractive layers to set deposition conditions for the low refractive layers and the high refractive layers.

Patent Literature 1 discloses two modes for setting the deposition conditions of the low refractive layers and the high refractive layers based on the change with time in the deposition rate estimated for each of the low refractive layers and the high refractive layers. In one of the modes, the rotation number of a substrate during the deposition of each of the low refractive layers and the high refractive layers constituting the multilayer reflective film is set to 1 rpm or more and 80 rpm or less, and the rotation number of the substrate is controlled for each layer (each of the low refractive layers and the high refractive layers) constituting the multilayer reflective film so as to reduce the rotation number of the substrate gradually. In the other mode, the rotation number of the substrate during the deposition of each of the low refractive layers and the high refractive layers constituting the multilayer reflective film is set to 80 rpm or more and 300 rpm or less, and the rotation number of the substrate is fixed or substantially fixed.

The aforementioned "rotation number of the substrate" can be regarded to mean "rotation speed of the substrate" because it is designated by rpm as its unit.

On the other hand, an object of Patent Literature 2 is to suppress an in-plane film thickness distribution of a multilayer reflective film caused by an azimuth deviation in rotation of a substrate between at the start of deposition of low refractive layers and high refractive layers and at the end of the deposition thereof. In order to attain the object, according to Patent Literature 2, the azimuth (deposition start position) at the start of deposition of each layer (each of the low refractive layers and high refractive layers) is changed to form the layer. Thus, the deposition start position of each layer is dispersed. In this manner, the in-plane distribution of a diffusion layer formed between the layers is suppressed from being accumulated, so that the in-plane film thickness distribution of the multilayer reflective film can be suppressed.

In the aforementioned one mode for setting the deposition conditions of the low refractive layers and the high refractive layers in Patent Literature 1, it is suggested that the rotation number of the substrate (the rotation speed of the substrate) is controlled for each layer (each of the low refractive layers and the high refractive layers) constituting the multilayer reflective film. However, it is practically difficult to control, as shown in FIG. 6 of Patent Literature 1, the rotation number of the substrate (the rotation speed of the substrate) for each layer of 80 or more layers constituting the multilayer reflective film. In addition, even if it is possible to perform such control, it will spend a long time for the control until the rotation number of the substrate (the rotation speed of the substrate) for each layer is stabilized. Thus, the throughput is lowered. Further, when the rotation number of the substrate (the rotation speed of the substrate) is changed for each layer, a risk of occurrence of defects may increase due to a dynamic action caused by the change of the rotation speed.

On the other hand, the other mode for setting the deposition conditions of the low refractive layers and the high refractive layers in Patent Literature 1, it is suggested that the rotation number of the substrate (the rotation speed of the substrate) during the deposition of each layer constituting the multilayer reflective film is controlled to be 80 rpm or more and 300 rpm or less. However, it is practically difficult to control the rotation of the substrate at such a high speed. In addition, even if such control can be carried out, a risk of occurrence of defects may increase.

Also in Patent Literature 2, it is practically difficult to perform control to change the deposition start position of each layer as to the 80 or more layers constituting the multilayer reflective film.

The aforementioned problem relating to the in-plane distribution of film thickness during formation of a multilayer film can be also a problem in a multilayer film-deposited substrate for other applications severely required as to the in-plane uniformity of the film thickness.

CITATION LIST

Patent Literatures

Patent Literature 1: JP-A-2014-130977
Patent Literature 2: JP-A-2014-130976

SUMMARY OF INVENTION

Problem that the Invention is to Solve

In order to solve the foregoing problems in conventional art, an object of the present invention is to provide a multilayer film-deposited substrate and a method for manufacturing the same, capable of easily controlling deposition conditions and suppressing an in-plane distribution of film thickness without causing a risk of defects occurring during deposition.

Means for Solving the Problem

As a result of intensive studies to attain the foregoing object, the present inventors obtained the following findings.

When obtaining a multilayer film-deposited substrate such as a multilayer reflective film-deposited substrate for a reflective type mask, by stacking a plurality of lamination units while rotating the substrate around its central axis, in which each of the lamination units has a plurality of layers formed by a dry deposition, in-plane uniformity in the film thickness of the multilayer reflective film formed is lowered. A factor thereof is that a deposition start position and a deposition end position in each layer constituting the multilayer reflective film are not fixed but changed gradually.

The change of the deposition start position is affected by the following three parameters.

Deposition time of each of the layers constituting the multilayer reflective film
Time interval between layers (between depositions of the layers) constituting the multilayer reflective film
Rotation speed of the substrate Once the three parameters are set into predetermined conditions, it may be regarded to be possible to suppress the lowering of the in-plane uniformity in the film thickness of the multilayer reflective film.

However, when a plurality of multilayer reflective film-deposited substrates are manufactured by using the same deposition apparatus, it is necessary to pay attention to a change with time in a deposition rate. For example, when a sputtering apparatus is used for deposition of each layer constituting a multilayer reflective film, the deposition rate is lowered due to formation of erosion in a sputtering target, or the like. Therefore, of the aforementioned parameters, the deposition time of each layer constituting the multilayer reflective film must be controlled to correct the lowering of the deposition rate.

Accordingly, the change with time in the deposition rate must be estimated and the three parameters must be controlled to satisfy predetermined conditions. The change with time in the deposition rate is a comparatively gradual change. Therefore, it may not be necessary to control the rotation number of the substrate or the deposition start position for each layer (each of the low refractive layers and the high refractive layers) constituting the multilayer reflective film as in the suggestion in Patent Literature 1 or 2. In the process for manufacturing a plurality of the multilayer reflective film-deposited substrates using a single deposition apparatus, the change with time in the deposition rate may be estimated and the three parameters may be controlled to satisfy the predetermined conditions. For example, with the estimation of change with time in the deposition rate, a certain number of, for example, five to ten, multilayer reflective film-deposited substrates are manufactured. At this time, at least one of the three parameters may be controlled so that the three parameters can satisfy the predetermined conditions, and then the manufacturing of multilayer reflective film-deposited substrates may be resumed. Incidentally, one multilayer reflective film-deposited substrate may be manufactured and at this time, at least one of the three parameters may be controlled.

Thus, it is easy to control the deposition conditions, and it is possible to suppress the in-plane distribution of film thickness without causing a risk of occurrence of defects during deposition.

The present invention has been made based on the aforementioned findings. The present invention provides a method for manufacturing a multilayer film-deposited substrate including a substrate and a multilayer film containing a plurality of lamination units and provided on the substrate, the method including: stacking the plurality of lamination units on the substrate while rotating the substrate around a rotational axis perpendicular to a substrate surface thereof, in which each of the lamination units has a plurality of layers formed by a dry deposition process, in which:

when a plurality of the multilayer film-deposited substrates are manufactured by using the dry deposition process, a deposition is performed in a condition satisfying at least one of the following requirements (1) and (2), with estimating a change with time in a deposition rate.

$$T_{depo-unit}/T_r < (m-0.02) \text{ or } (m+0.02) < T_{depo-unit}/T_r \quad (1)$$

$$(n-0.02) \leq T_i/T_r \leq (n+0.02) \quad (2)$$

In the requirements (1) and (2), m and n are independently any integer, $T_i$ is a time interval between the depositions among each layer of the plurality of layers included in the lamination unit, $T_{depo-unit}$ ($=T_{depo-total}+T_{i-total}$) is a deposition unit time required for depositing the one lamination unit, which is the sum of $T_{depo-total}$ and $T_{i-total}$, in which $T_{depo-total}$ is a total deposition time of the plurality of layers included in the lamination unit and $T_{i-total}$ is a total of the time intervals $T_i$'s, and $T_r$ is a rotation period of the substrate.

In the method for manufacturing the multilayer film-deposited substrate according to the present invention, it is preferable that the multilayer film-deposited substrate has an in-plane distribution in a total film thickness of the multilayer film being 0.2% or less.

In the method for manufacturing the multilayer film-deposited substrate according to the present invention, it is preferable that the multilayer film is a multilayer reflective film obtained by stacking a plurality of the lamination units, in which each of the lamination units has a high refractive layer-low refractive layer structure, or each of the lamination units has a low refractive layer-high refractive layer structure.

It is preferable that the multilayer reflective film has an in-plane distribution of a centroid wavelength of an EUV reflected light being 0.030 nm or less.

In the method for manufacturing the multilayer film-deposited substrate according to the present invention, in which the multilayer film is the multilayer reflective film, a protective layer for the multilayer reflective film may be formed on the multilayer reflective film.

In the method for manufacturing the multilayer film-deposited substrate according to the present invention, in which the multilayer film is the multilayer reflective film, an absorption layer that absorbs an EUV light may be formed on the multilayer reflective film or on the protective layer for the multilayer reflective film.

In the method for manufacturing the multilayer film-deposited substrate according to the present invention, in which the absorption layer is formed, a low reflection layer having a low reflection with regard to an inspection light for use in an inspection of a mask pattern may be formed on the absorption layer.

In the method for manufacturing the multilayer film-deposited substrate according to the present invention, it is preferable that the deposition is performed in a condition satisfying the requirement (2).

In the method for manufacturing the multilayer film-deposited substrate according to the present invention, it is preferable that the time interval $T_i$ between the depositions among the each layer is controlled to satisfy the requirements (1) and/or (2).

In the method for manufacturing the multilayer film-deposited substrate according to the present invention, the rotation period of the substrate $T_r$ may be controlled to satisfy the requirements (1) and/or (2).

In the method for manufacturing the multilayer film-deposited substrate according to the present invention, the deposition unit time $T_{depo-unit}$ required for depositing the one lamination unit may be controlled to satisfy the requirement (1).

In addition, the present invention provides a multilayer film-deposited substrate, including a substrate and a multilayer film provided thereon, in which the multilayer film-deposited substrate has an in-plane distribution in a total film thickness of the multilayer film being 0.2% or less.

It is preferable that the multilayer film-deposited substrate has a circumferential in-plane distribution in the total film thickness of the multilayer film being 0.07% or less.

In the multilayer film-deposited substrate according to the present invention, it is preferable that the multilayer film is a multilayer reflective film obtained by stacking a plurality of lamination units, in which each of the lamination units has a high refractive layer-low refractive layer structure, or each of the lamination units has a low refractive layer-high refractive layer structure.

It is preferable that the multilayer reflective film has an in-plane distribution of a centroid wavelength of an EUV reflected light being 0.030 nm or less.

It is preferable that the multilayer reflective film has a circumferential in-plane distribution of a centroid wavelength of an EUV reflected light being 0.010 nm or less.

Advantage of the Invention

According to the present invention, when a plurality of multilayer film-deposited substrates are manufactured, deposition conditions are controlled with estimating a change with time in a deposition rate to satisfy the conditions of (1) and/or (2). Specifically, at least one of a deposition time of each of layers constituting a multilayer film, a time interval between layers constituting the multilayer film, and a rotation period of a substrate is controlled. Thus, an in-plane distribution in film thickness of the multilayer film can be suppressed.

It is therefore easy to control the deposition conditions, and it is possible to suppress the in-plane distribution in the film thickness without causing a risk of occurrence of defects during deposition.

When the deposition conditions are controlled at the start of manufacturing the multilayer film-deposited substrate to satisfy the condition of (2), the in-plane distribution in the film thickness of the multilayer film can be suppressed without controlling the deposition conditions after that, independently of the change with time in the deposition rate in a course in which a plurality of such multilayer film-deposited substrates are manufactured.

MODE FOR CARRYING OUT THE INVENTION

The present invention will be described below with reference to the drawings.

A method for manufacturing a multilayer film-deposited substrate according to the present invention is a method for manufacturing a multilayer film-deposited substrate including a substrate and a multilayer film provided thereon. In the method for manufacturing a multilayer film-deposited substrate according to the present invention, a plurality of lamination units are stacked while rotating the substrate around a rotational axis perpendicular to a substrate surface thereof, in which each of the lamination units has a plurality of layers formed by a dry deposition process. Thus, the multilayer film-deposited substrate can be obtained.

In the present specification, a specific example of the multilayer film includes a multilayer reflective film, in which a plurality of lamination units are stacked on the substrate, in which each of the lamination units has a high refractive layer-low refractive layer structure, or each of the lamination units has a low refractive layer-high refractive layer structure, so that a reflectivity of EUV light can be enhanced. In the present specification, the method for manufacturing a multilayer film-deposited substrate according to the present invention will be described with reference to the manufacture of a Si/Mo multilayer reflective film-deposited substrate using Si layers as high refractive layers and Mo layers as low refractive layers on the substrate, as an example. In the Si/Mo multilayer reflective film-deposited substrate, a plurality of lamination units are stacked on the substrate, in which each of the lamination units has a Si layer and a Mo layer in this order. Thus, the reflectivity of EUV (Extreme Ultraviolet) light can be enhanced.

The multilayer reflective film-deposited substrate in which high refractive layers are Si layers and low refractive layers are Mo layers may be replaced by a Mo/Si multilayer reflective film-deposited substrate obtained by stacking a plurality of lamination units on the substrate, in which each of the lamination units has a Mo layer and a Si layer in this order.

When the Si/Mo multilayer film-deposited substrate is manufactured, a lamination unit having a Si layer and a Mo layer is formed by using an ion beam sputtering method as a dry deposition method, while rotating the substrate around a rotational axis perpendicular to a substrate surface thereof. Setting this as one lamination unit, a plurality of the lamination units are stacked to obtain the Si/Mo multilayer film-deposited substrate.

Figure 1:
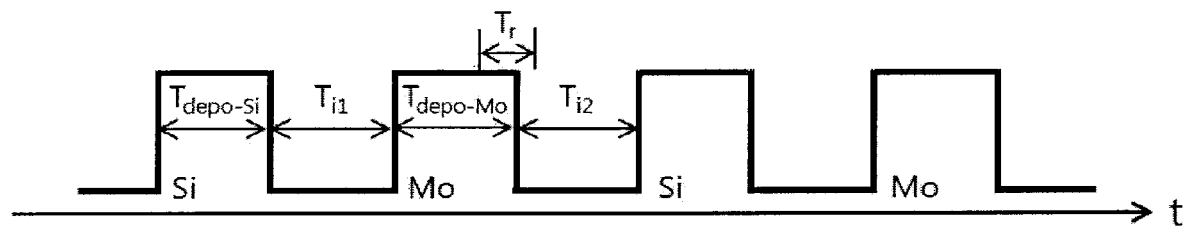
FIG. 1 is a view schematically illustrating a change with time in an ion beam current when a Si/Mo multilayer film-deposited substrate is manufactured by using an ion beam sputtering method.

FIG. 1 is a view schematically illustrating a change with time in an ion beam current as a deposition parameter when the Si/Mo multilayer film-deposited substrate is manufactured by using an ion beam sputtering method.

As illustrated in FIG. 1, the ion beam current rises only when each Si layer is formed and when each Mo layer is formed. Thus, a deposition time $T_{depo\text{-}Si}$ of the Si layer and a deposition time $T_{depo\text{-}Mo}$ of the Mo layer can be determined from a time during which the ion beam current is rising. Time intervals $T_{i1}$ and $T_{i2}$ between the layers (between the depositions of layers) can be determined from a time during which the ion beam current is not rising. The time intervals $T_{i1}$ and $T_{i2}$ between the layers may be identical to each other or different from each other.

The Tr in FIG. 1 is a rotation period of a substrate during formation of the Si layers and the Mo layers, which exemplifies a time per one rotation.

Figure 2:
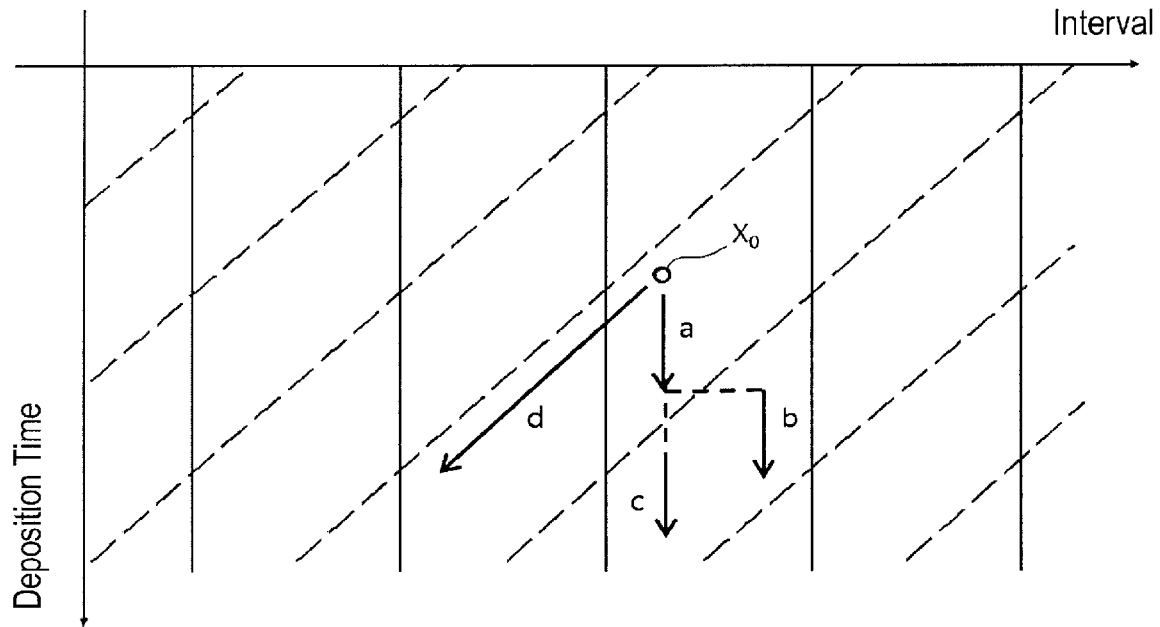
FIG. 2 is a schematic view illustrating influence of a deposition time and an interval between layers on a level of in-plane uniformity in film thickness of the multilayer film when the multilayer film-deposited substrate is manufactured, in which an example of adjustment of each parameter with an estimation of change with time in a deposition rate according to a method of the present invention is illustrated.

The aforementioned three parameters, i.e. the deposition time, the time interval and the substrate rotation speed, affect the in-plane uniformity in the film thickness of the Si/Mo multilayer reflective film formed on the substrate. Of the three parameters, the substrate rotation speed was fixed while the deposition time of each layer and the time interval between the layers were changed. Under the conditions set thus, Si/Mo multilayer reflective films were manufactured, and the in-plane uniformity in the total film thickness of each Si/Mo multilayer reflective film was examined. Based on results obtained thus, influence of the deposition time of each of layers and the time interval between the layers on the in-plane uniformity in the film thickness of the multilayer film in the manufacturing of the multilayer film-deposited substrate was evaluated. FIG. 2 is a schematic view illustrating the influence of the deposition time of each layer and the time interval between the layers on the in-plane uniformity in the film thickness of the multilayer film in the manufacturing of the multilayer film-deposited substrate.

In FIG. 2, the broken lines extending obliquely designate conditions where the in-plane uniformity in the film thickness of the multilayer film becomes low. On the other hand, in FIG. 2, the solid lines extending vertically designate conditions where the in-plane uniformity in the film thickness of the multilayer film becomes high. In conditions excluding the both, that is, in conditions excluding the cases on the broken lines extending obliquely and the cases on the solid lines extending vertically in FIG. 2, the in-plane uniformity in the film thickness of the multilayer film shows an intermediate level between the both. That is, the in-plane uniformity in the film thickness of the multilayer film is higher than that on the broken lines extending obliquely, but the in-plane uniformity in the film thickness of the multilayer film is lower than that on the solid lines extending vertically. Further, in FIG. 2, in conditions on the broken lines extending obliquely and at the same time on the solid lines extending vertically, the in-plane uniformity in the film thickness of the multilayer film becomes high. From FIG. 2, it can be considered that the lowering of the in-plane uniformity in the film thickness of the multilayer film can be suppressed when the deposition time of each layer and the time interval between the layers are set to predetermined conditions.

Figure 3:
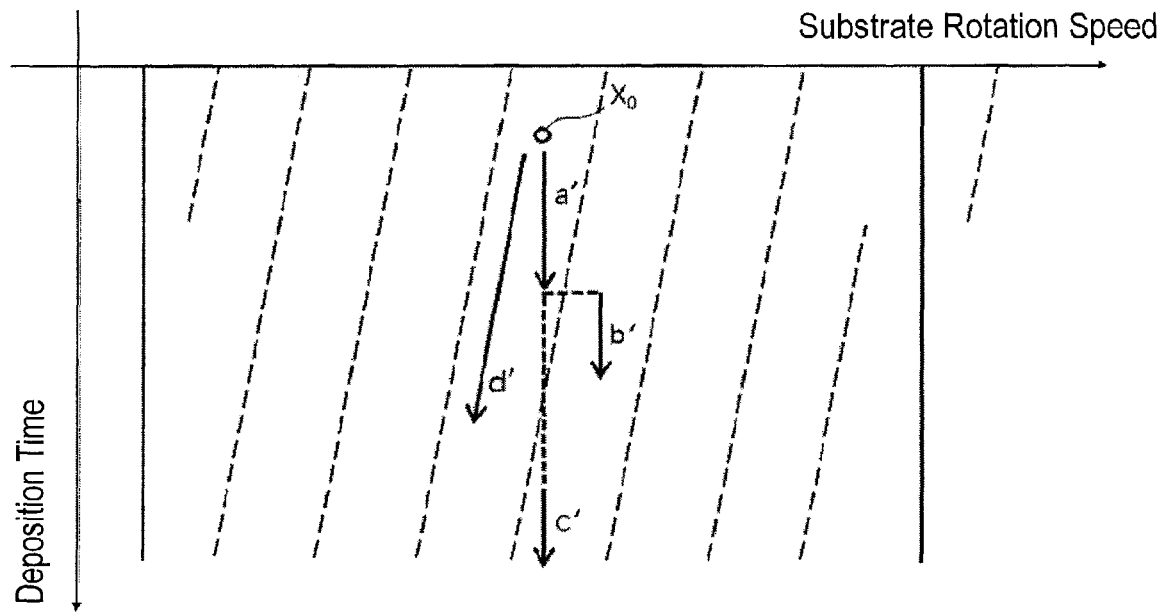
FIG. 3 is a schematic view illustrating influence of a deposition time and a substrate rotation speed on a level of in-plane uniformity in film thickness of the multilayer film when the multilayer film-deposited substrate is manufactured, in which an example of adjustment of each parameter with an estimation of change with time in a deposition rate according to a method of the present invention is illustrated.

Of the three parameters, the time interval between the layers was fixed while the deposition time of each layer and the substrate rotation speed were changed. Under the conditions set thus, Si/Mo multilayer reflective films were manufactured, and the level of the in-plane uniformity in the total film thickness of each multilayer reflective film was examined. Based on results obtained thus, influence of the deposition time of each layer and the substrate rotation speed on the in-plane uniformity in the film thickness of the multilayer film in the manufacturing of the multilayer film-deposited substrate was evaluated. FIG. 3 is a schematic view illustrating the influence of the deposition time of each layer and the substrate rotation speed on the in-plane uniformity in the film thickness of the multilayer film in the manufacturing of the multilayer film-deposited substrate. From the evaluation results obtained thus, it can be considered that the lowering of the in-plane uniformity in the film thickness of the multilayer film can be suppressed when the deposition time of each layer and the substrate rotation speed are set to predetermined conditions.

From the findings obtained thus, it can be considered that as long as a single multilayer reflective film-deposited substrate is manufactured, the lowering of the in-plane uniformity in the film thickness of the multilayer reflective film can be suppressed when the three parameters are set to predetermined conditions. For example, in the case of FIG. 2, it can be considered that the lowering of the in-plane uniformity in the film thickness of the multilayer reflective film can be suppressed when the deposition time of each layer and the time interval between the layers are set to bypass the broken lines extending obliquely in the figure. Also in the case of FIG. 3, it can be considered that the lowering of the in-plane uniformity in the film thickness of the multilayer reflective film can be suppressed when the deposition time of each layer and the substrate rotation speed are set to bypass the broken lines extending obliquely in the figure.

However, from a viewpoint of the manufacturing cost, the stabilization of deposition process control by continuous deposition, etc., it is desired that a plurality of multilayer film-deposited substrates are manufactured by using the same deposition apparatus.

When a plurality of multilayer film-deposited substrates are manufactured by using the same deposition apparatus, the deposition rate with which each layer is formed is lowered due to erosion of a sputtering target or the like. It is therefore necessary to enlarge the deposition time of each layer in accordance with the lowering of the deposition rate. In this case, even when the deposition conditions are initially set to bypass the broken lines extending obliquely as indicated by $X_0$ in FIG. 2, the deposition time of each layer becomes longer in accordance with the lowering of the deposition rate as indicated by the arrow a. As a result, the deposition conditions move in a direction approaching the broken line extending obliquely. Thus, the lowering of the in-plane uniformity in the film thickness of the multilayer film becomes a problem.

It is therefore necessary to estimate a change with time in the deposition rate and set the three parameters to predetermined conditions. As methods for setting the three parameters to predetermined conditions with the estimation of change with time in the deposition rate, there are, for example, following methods.

(1) A method in which when the deposition conditions approach any broken line extending obliquely in FIG. 2 along with increase in the deposition time of each layer corresponding to the lowering of the deposition rate, the time interval between the layers is changed to bypass the broken line extending obliquely (arrow a and arrow b).

(2) A method in which when the deposition conditions approach any broken line extending obliquely in FIG. 2 along with increase in the deposition time of each layer corresponding to the lowering of the deposition rate, the deposition time between the layers is changed to bypass the broken line extending obliquely (arrow a and arrow c). When the broken line extending obliquely is bypassed, deposition on a multilayer film-deposited substrate requiring in-plane uniformity may be suspended.

(3) A method in which initial setting is done so that the time interval between the layers can be laid on the solid lines extending vertically in FIG. 2.

(4) A method in which the deposition time of each layer corresponding to the lowering of the deposition rate and the substrate rotation speed are changed at the same time. The transition of the deposition conditions may be set so that it does not cross the broken line extending obliquely, and it is preferably changed so that the both become parallel to each other as illustrated in FIG. 2 (arrow d).

The method for manufacturing a multilayer film-deposited substrate according to the present invention is what the aforementioned concepts are implemented. Specifically, when a plurality of the multilayer film-deposited substrates are manufactured by using the dry deposition process, a deposition is performed in a condition satisfying at least one of the following requirements (1) and (2), with estimating a change with time in a deposition rate.

$$T_{depo\text{-}unit}/T_r < (m-0.02) \text{ or } (m+0.02) < T_{depo\text{-}unit}/T_r \quad (1)$$

$$(n-0.02) \le T_i/T_r \le (n+0.02) \quad (2)$$

In the requirements (1) and (2), m and n are independently any integer, $T_i$ is a time interval between the depositions among each layer of the plurality of layers included in the lamination unit, $T_{depo\text{-}unit}$ ($=T_{depo\text{-}total}+T_{i\text{-}total}$) is a deposition unit time required for depositing the one lamination unit, which is the sum of $T_{depo\text{-}total}$ and $T_{i\text{-}total}$ in which $T_{depo\text{-}total}$ is a total deposition time of the plurality of layers included in the lamination unit and $T_{i\text{-}total}$ is a total of the time intervals $T_i$'s, and $T_r$ is a rotation period of the substrate.

Here, the total deposition time $T_{depo\text{-}total}$ of the plurality of layers included in the lamination unit corresponds to a sum of the deposition time $T_{depo\text{-}Si}$ of the Si layer and the deposition time $T_{depo\text{-}Mo}$ of the Mo layer in FIG. 1. The $T_{i\text{-}total}$ being total of time intervals $T_i$'s between the layers of the plurality of layers corresponds to the sum of the time intervals $T_{i1}$ and $T_{i2}$ between the layers in FIG. 1. The deposition unit time $T_{depo\text{-}unit}$ ($=T_{depo\text{-}total}+T_{i\text{-}total}$) required for depositing one lamination unit corresponds to $T_{depo\text{-}Si}+T_{i1}+T_{depo\text{-}Mo}+T_{i2}$. $T_r$ corresponds to 60/N (sec) in view of a relation to the substrate rotation speed N (rpm) during formation of the Si layer and the Mo layer in FIG. 1. The time interval $T_i$ between the layers in the aforementioned (2) corresponds to $T_{i1}$, $T_{i2}$ in FIG. 1.

$T_{depo\text{-}unit}/T_r$ can take any integer m when the deposition conditions are on the broken lines extending obliquely in FIG. 2. Accordingly, the aforementioned (1) means that the deposition conditions are set to bypass the broken lines extending obliquely in FIG. 2. In the (1), not m but m±0.02 is used because the in-plane uniformity in the film thickness of the multilayer film may be lowered not only on the broken lines extending obliquely but in the vicinities thereof. Incidentally, m±0.08 may be used for a product required to have high optical properties.

On the other hand, $T_i/T_r$ can take any integer n when the deposition conditions are on the solid lines extending vertically in FIG. 2. Accordingly, the aforementioned (2) means that the deposition conditions are set on the solid lines extending vertically in FIG. 2. In the (2), not n but n±0.02 is used because the in-plane uniformity in the film thickness of the multilayer film may be increased not only on the solid lines extending vertically but in the vicinities thereof.

In the method for manufacturing the multilayer film-deposited substrate according to the present invention, deposition is performed on conditions satisfying at least one of the (1) and (2) to thereby improve the in-plane uniformity in the film thickness of the multilayer film.

In the method for manufacturing the multilayer film-deposited substrate according to the present invention, deposition may be performed on conditions satisfying only one of the (1) and (2) or deposition may be performed on conditions satisfying both the (1) and (2).

In view from a relation to the findings with regard to the method for manufacturing the multilayer film-deposited substrate according to the present invention as described above, it is more preferable that deposition is performed on conditions satisfying the (2) rather than on conditions satisfying the (1) because the in-plane uniformity in the film thickness of the multilayer film becomes higher. However, when time intervals between layers of a plurality of layers included in one lamination unit are different from each other, it is necessary to perform deposition on conditions where all the time intervals satisfy the (2).

Although the method for manufacturing the multilayer film-deposited substrate according to the present invention has been described above with reference to the manufacture of a Si/Mo multilayer reflective film-deposited substrate as an example, the present invention is not limited thereto. The method for manufacturing the multilayer film-deposited substrate according to the present invention can be applied to a wide variety of methods for manufacturing multilayer film-deposited substrates each including a substrate and a multilayer film provided thereon as defined above. According to the method, a plurality of lamination units are stacked while rotating a substrate around a rotational axis perpendicular to a substrate surface thereof, in which each of the lamination units has a plurality of layers formed by a dry deposition process. Thus, the multilayer film-deposited substrate is obtained. Therefore, the dry deposition process may be a sputtering method other than the ion beam sputtering method, or may be a dry deposition process such as a CVD method or a PVD method other than the sputtering method. Further, the number of layers constituting the lamination unit is not limited to two layers but may be three layers or more.

In addition, although the change with time in the deposition rate has been described above in the case where the deposition rate is lowered, the method for manufacturing the multilayer film-deposited substrate according to the present invention can be also applied to the case where the deposition rate is increased.

As described above, according to the method for manufacturing the multilayer film-deposited substrate according to the present invention, the in-plane uniformity in the film thickness of the multilayer film formed on the substrate becomes high. The in-plane distribution in the total film thickness of the multilayer film is preferably 0.2% or less, more preferably 0.14% or less, and further more preferably 0.07% or less.

When the multilayer film is a multilayer reflective film, the in-plane distribution of a centroid wavelength of EUV reflected light is preferably 0.03 nm or less, more preferably 0.02 nm or less, and further more preferably 0.01 run or less.

According to the method for manufacturing the multilayer film-deposited substrate according to the present invention, it is possible to improve a circumferential in-plane distribution equally independently of the surface size of the substrate on which the multilayer film is formed.

Therefore, the circumferential in-plane distribution in the total film thickness of the multilayer film is preferably 0.2% or less, more preferably 0.14% or less, and further more preferably 0.07% or less.

When the multilayer film is a multilayer reflective film, the circumferential in-plane distribution of a centroid wavelength of EUV reflected light is preferably 0.03 nm or less, more preferably 0.02 nm or less, and further more preferably 0.01 nm or less.

A multilayer film-deposited substrate where the in-plane distribution in the total film thickness of the multilayer film satisfies the aforementioned conditions is also included as a subject of protection of the present invention.

When the multilayer film is a multilayer reflective film, a protective layer for the multilayer reflective film may be formed on the multilayer reflective film. Further, when the multilayer reflective film-deposited substrate is used as a reflective type mask blank for lithography for use in the manufacturing of semiconductors or the like, it is preferable that an absorption layer that absorbs EUV light is formed on the multilayer reflective film, or on the protective layer when a protective layer is formed on the multilayer reflective film. A low reflection layer having a lower reflection with regard to inspection light for use in inspection of a mask pattern may be formed on the absorption layer in accordance with necessity, in which the reflection is lower than that of the multilayer reflective film (including the protective layer, in the case where the protective layer is formed) after patterning.

Examples

The present invention will be further described below using Examples.

In each of Examples and Comparative Examples shown below, a Si/Mo multilayer reflective film is formed on a substrate in the following procedure.

<Procedure of Forming Si/Mo Multilayer Reflective Film>

A substrate having a size of 152 mm×152 mm is rotated around a rotational axis perpendicular to a substrate surface thereof while a Si/Mo multilayer reflective film is formed on the surface of the substrate by use of an ion beam sputtering method. 40 lamination units are stacked, in which each of the lamination units has two layers, that is, a Si layer having a film thickness of 4.5 nm and a Mo layer having a film thickness of 2.5 nm (total film thickness of 7.0 nm). Thus, a Si/Mo multilayer reflective film having a total film thickness of 280 nm ((4.5 nm+2.5 nm)×40) is formed.

Deposition conditions of the Si layer and the Mo layer are as the following.

<Deposition Conditions of Si Layer>
Target: Si target
Sputtering gas: Ar gas
Film thickness: 4.5 nm <Deposition Conditions of Mo Layer>
Target: Mo target
Sputtering gas: Ar gas
Film thickness: 2.5 nm The deposition time of Si layer and Mo layer was controlled so that the Si layer and the Mo layer each have a constant film thickness. A deposition unit time $T_{depo\text{-}unit}$ (sec) required for depositing the one lamination unit will be described in the following Table 1. An interval $T_{i1}$ (sec) between the Si layer and the Mo layer and an interval $T_{i2}$ (sec) between the Mo layer and the Si layer will also be described in the following Table 1. However, in Examples 7, 14, 23, and 32, the following procedure is carried out. As indicated by the arrow b in FIG. 2, when the deposition conditions approach a broken line extending obliquely, the time interval ($T_{i1}$ or $T_{i2}$) between the layers is changed to bypass the broken line. Specifically, the time interval between the layers is changed as follows.

|  | Before change | After change |
|---|---|---|
| Example 7 | 10.02 sec | 11.00 sec |
| Example 14 | 10.02 sec | 10.60 sec |
| Example 23 | 10.80 sec | 11.50 sec |
| Example 32 | 10.80 sec | 11.30 sec |

The substrate rotation speed during the formation of the Si layer and during the formation of the Mo layer is kept in conditions described in the following Table 1. However, in Examples 6, 13, 22, and 31, the following procedure is carried out. FIG. 3 similar to FIG. 2 can be created as to influence of the deposition time of each layer and the substrate rotation speed during formation of the layers on the in-plane uniformity in the film thickness of the multilayer film in the manufacturing of the multilayer film-deposited substrate. In the views, when the deposition conditions approach a broken line extending obliquely, the substrate rotation speed (N) during formation of each layer is changed to bypass the broken line as indicated in the arrow b'. Specifically, the substrate rotation speed (N) during formation of each layer is changed as follows.

|  | Before change | After change |
|---|---|---|
| Example 6 | 25.00 rpm | 25.60 rpm |
| Example 13 | 25.00 rpm | 25.60 rpm |
| Example 22 | 25.00 rpm | 26.10 rpm |
| Example 31 | 25.00 rpm | 26.30 rpm |

As for each of the Si/Mo multilayer reflective films formed in the aforementioned procedures, an in-plane distribution of a centroid wavelength of EUV reflected light is obtained by the following procedures. The surface of the Si/Mo multilayer reflective film formed is radiated with EUV light with an incident angle of 6 degrees. The EUV reflected light at this time is measured by using an EUV reflectometer (MBR manufactured by AIXUV) to evaluate the in-plane distribution of a centroid wavelength of the reflected light in the wavelength region. At more than four positions in a circumferential direction having a radius of 30 mm from the center of the substrate, the centroid wavelength of the reflected light in an EUV wavelength region is measured and the difference between the maximum value and the minimum value of the measured values is obtained, thereby determining an in-plane distribution of the centroid wavelength of the reflected light. The in-plane distribution of the centroid wavelength of the reflected light is defined as the in-plane distribution of the centroid wavelength of EUV reflected light.

Signs in the following Table 1 mean as follows.
⊚: 0.01 nm or less
○: higher than 0.01 nm and 0.02 nm or less
Δ: higher than 0.02 nm and 0.03 nm or less
x: higher than 0.03 nm The centroid wavelength of the EUV reflected light has a corresponding relation to interference of reflected light depending on the film thickness of one lamination unit of the Si/Mo multilayer reflective film and the total film thickness of the multilayer film obtained by stacking a plurality of the lamination units. The in-plane distributions thereof typically coincide with each other.

The in-plane distribution of the centroid wavelength of the EUV reflected light and the in-plane distribution in the total film thickness of the multilayer film are correlated with each other, and they satisfy the following relational equation.

(In-plane distribution of centroid wavelength of reflected light [nm])/(centroid wavelength of reflected light(13.5 nm in the case of EUV) [nm])×100=(in-plane distribution in total film thickness of multilayer film[%])

For example, in the case where the in-plane distribution of the centroid wavelength of the EUV reflected light is 0.01 nm, the in-plane distribution in the total film thickness of the multilayer film is 0.01/13.5×100=0.07%.

TABLE 1

|  | $T_{depo\text{-}unit}$ | $T_r$ | In-plane distribution of centroid wavelength | $T_{i1}$ | $T_{i2}$ | N | $T_{depo\text{-}unit}/T_r$ (a) | $T_{i1}/T_r$ (b) | $T_{i2}/T_r$ (c) | Absolute value of difference from closest integer to (a), (b), (c) | | |
|---|---|---|---|---|---|---|---|---|---|---|---|---|
|  | sec | sec |  | sec | sec | rpm |  |  |  | (a) | (b) | (c) |
| Ex. 1 | 124.02 | 2.400 | ○ | 10.02 | 10.02 | 25.00 | 51.675 | 4.175 | 4.175 | 0.3250 | 0.1750 | 0.1750 |
| Ex. 2 | 124.26 | 2.400 | ○ | 10.02 | 10.02 | 25.00 | 51.775 | 4.175 | 4.175 | 0.2250 | 0.1750 | 0.1750 |
| Ex. 3 | 114.54 | 2.400 | ○ | 10.02 | 10.02 | 25.00 | 47.725 | 4.175 | 4.175 | 0.2750 | 0.1750 | 0.1750 |
| Ex. 4 | 124.62 | 2.400 | Δ | 10.02 | 10.02 | 25.00 | 51.925 | 4.175 | 4.175 | 0.0750 | 0.1750 | 0.1750 |
| Ex. 5 | 124.70 | 2.400 | Δ | 10.02 | 10.02 | 25.00 | 51.958 | 4.175 | 4.175 | 0.0417 | 0.1750 | 0.1750 |
| Com. Ex. 1 | 124.76 | 2.400 | x | 10.02 | 10.02 | 25.00 | 51.983 | 4.175 | 4.175 | 0.0167 | 0.1750 | 0.1750 |
| Com. Ex. 2 | 124.82 | 2.400 | x | 10.02 | 10.02 | 25.00 | 52.008 | 4.175 | 4.175 | 0.0083 | 0.1750 | 0.1750 |
| Ex. 6 | 124.82 | 2.344 | ○ | 10.02 | 10.02 | 25.60 | 53.257 | 4.275 | 4.275 | 0.2565 | 0.2752 | 0.2752 |
| Ex. 7 | 126.78 | 2.400 | ○ | 11.00 | 11.00 | 25.00 | 52.825 | 4.583 | 4.583 | 0.1750 | 0.4167 | 0.4167 |
| Com. Ex. 3 | 124.84 | 2.400 | x | 10.02 | 10.02 | 25.00 | 52.017 | 4.175 | 4.175 | 0.0167 | 0.1750 | 0.1750 |
| Ex. 8 | 124.96 | 2.400 | Δ | 10.02 | 10.02 | 25.00 | 52.067 | 4.175 | 4.175 | 0.0667 | 0.1750 | 0.1750 |
| Ex. 9 | 125.22 | 2.400 | ○ | 10.02 | 10.02 | 25.00 | 52.175 | 4.175 | 4.175 | 0.1750 | 0.1750 | 0.1750 |
| Ex. 10 | 125.58 | 2.400 | ○ | 10.02 | 10.02 | 25.00 | 52.325 | 4.175 | 4.175 | 0.3250 | 0.1750 | 0.1750 |

TABLE 1-continued

| | $T_{depo\text{-}unit}$ | $T_r$ | In-plane distribution of centroid | $T_{i1}$ | $T_{i2}$ | N | $T_{depo\text{-}unit}/T_r$ (a) | $T_{i1}/T_r$ (b) | $T_{i2}/T_r$ (c) | Absolute value of difference from closest integer to (a), (b), (c) | | |
|---|---|---|---|---|---|---|---|---|---|---|---|---|
| | sec | sec | wavelength | sec | sec | rpm | (a) | (b) | (c) | (a) | (b) | (c) |
| Ex. 11 | 126.66 | 2.400 | ○ | 10.02 | 10.02 | 25.00 | 52.775 | 4.175 | 4.175 | 0.2250 | 0.1750 | 0.1750 |
| Ex. 12 | 127.02 | 2.400 | ○ | 10.02 | 10.02 | 25.00 | 52.925 | 4.175 | 4.175 | 0.0750 | 0.1750 | 0.1750 |
| Com. Ex. 4 | 127.16 | 2.400 | × | 10.02 | 10.02 | 25.00 | 52.983 | 4.175 | 4.175 | 0.0167 | 0.1750 | 0.1750 |
| Com. Ex. 5 | 127.18 | 2.400 | × | 10.02 | 10.02 | 25.00 | 52.992 | 4.175 | 4.175 | 0.0083 | 0.1750 | 0.1750 |
| Ex. 13 | 127.18 | 2.344 | ○ | 10.02 | 10.02 | 25.60 | 54.263 | 4.275 | 4.275 | 0.2635 | 0.2752 | 0.2752 |
| Ex. 14 | 128.34 | 2.400 | ○ | 10.60 | 10.60 | 25.00 | 53.475 | 4.417 | 4.417 | 0.4750 | 0.4167 | 0.4167 |
| Com. Ex. 6 | 127.24 | 2.400 | × | 10.02 | 10.02 | 25.00 | 53.017 | 4.175 | 4.175 | 0.0167 | 0.1750 | 0.1750 |
| Ex. 15 | 127.34 | 2.400 | Δ | 10.02 | 10.02 | 25.00 | 53.058 | 4.175 | 4.175 | 0.0583 | 0.1750 | 0.1750 |
| Ex. 16 | 127.55 | 2.400 | ○ | 10.02 | 10.02 | 25.00 | 53.146 | 4.175 | 4.175 | 0.1458 | 0.1750 | 0.1750 |
| Ex. 17 | 127.72 | 2.400 | ○ | 10.02 | 10.02 | 25.00 | 53.217 | 4.175 | 4.175 | 0.2167 | 0.1750 | 0.1750 |
| Ex. 18 | 128.02 | 2.400 | ○ | 10.02 | 10.02 | 25.00 | 53.342 | 4.175 | 4.175 | 0.3417 | 0.1750 | 0.1750 |
| Ex. 19 | 123.96 | 2.400 | ○ | 10.80 | 10.80 | 25.00 | 51.650 | 4.500 | 4.500 | 0.3500 | 0.5000 | 0.5000 |
| Ex. 20 | 124.14 | 2.400 | ○ | 10.80 | 10.80 | 25.00 | 51.725 | 4.500 | 4.500 | 0.2750 | 0.5000 | 0.5000 |
| Ex. 21 | 124.44 | 2.400 | ○ | 10.80 | 10.80 | 25.00 | 51.850 | 4.500 | 4.500 | 0.1500 | 0.5000 | 0.5000 |
| Com. Ex. 7 | 124.76 | 2.400 | × | 10.80 | 10.80 | 25.00 | 51.983 | 4.500 | 4.500 | 0.0167 | 0.5000 | 0.5000 |
| Com. Ex. 8 | 124.78 | 2.400 | × | 10.80 | 10.80 | 25.00 | 51.992 | 4.500 | 4.500 | 0.0083 | 0.5000 | 0.5000 |
| Ex. 22 | 124.78 | 2.299 | ○ | 10.80 | 10.80 | 26.10 | 54.279 | 4.698 | 4.698 | 0.2793 | 0.3020 | 0.3020 |
| Ex. 23 | 126.18 | 2.400 | ○ | 11.50 | 11.50 | 25.00 | 52.575 | 4.792 | 4.792 | 0.4250 | 0.2083 | 0.2083 |
| Com. Ex. 9 | 124.84 | 2.400 | × | 10.80 | 10.80 | 25.00 | 52.017 | 4.500 | 4.500 | 0.0167 | 0.5000 | 0.5000 |
| Ex. 24 | 124.92 | 2.400 | Δ | 10.80 | 10.80 | 25.00 | 52.050 | 4.500 | 4.500 | 0.0500 | 0.5000 | 0.5000 |
| Ex. 25 | 124.98 | 2.400 | Δ | 10.80 | 10.80 | 25.00 | 52.075 | 4.500 | 4.500 | 0.0750 | 0.5000 | 0.5000 |
| Ex. 26 | 125.16 | 2.400 | ○ | 10.80 | 10.80 | 25.00 | 52.150 | 4.500 | 4.500 | 0.1500 | 0.5000 | 0.5000 |
| Ex. 27 | 115.58 | 2.400 | ○ | 10.80 | 10.80 | 25.00 | 48.158 | 4.500 | 4.500 | 0.1583 | 0.5000 | 0.5000 |
| Ex. 28 | 126.18 | 2.400 | ○ | 10.80 | 10.80 | 25.00 | 52.575 | 4.500 | 4.500 | 0.4250 | 0.5000 | 0.5000 |
| Ex. 29 | 126.82 | 2.400 | ○ | 10.80 | 10.80 | 25.00 | 52.842 | 4.500 | 4.500 | 0.1583 | 0.5000 | 0.5000 |
| Ex. 30 | 127.04 | 2.400 | Δ | 10.80 | 10.80 | 25.00 | 52.933 | 4.500 | 4.500 | 0.0667 | 0.5000 | 0.5000 |
| Com. Ex. 10 | 127.16 | 2.400 | × | 10.80 | 10.80 | 25.00 | 52.983 | 4.500 | 4.500 | 0.0167 | 0.5000 | 0.5000 |
| Com. Ex. 11 | 127.22 | 2.400 | × | 10.80 | 10.80 | 25.00 | 53.008 | 4.500 | 4.500 | 0.0083 | 0.5000 | 0.5000 |
| Ex. 31 | 127.22 | 2.281 | ○ | 10.80 | 10.80 | 26.30 | 55.765 | 4.734 | 4.734 | 0.2352 | 0.2660 | 0.2660 |
| Ex. 32 | 128.22 | 2.400 | ○ | 11.30 | 11.30 | 25.00 | 53.425 | 4.708 | 4.708 | 0.4250 | 0.2917 | 0.2917 |
| Com. Ex. 12 | 127.24 | 2.400 | × | 10.80 | 10.80 | 25.00 | 53.017 | 4.500 | 4.500 | 0.0167 | 0.5000 | 0.5000 |
| Ex. 33 | 127.30 | 2.400 | Δ | 10.80 | 10.80 | 25.00 | 53.042 | 4.500 | 4.500 | 0.0417 | 0.5000 | 0.5000 |
| Ex. 34 | 127.36 | 2.400 | Δ | 10.80 | 10.80 | 25.00 | 53.067 | 4.500 | 4.500 | 0.0667 | 0.5000 | 0.5000 |
| Ex. 35 | 127.56 | 2.400 | ○ | 10.80 | 10.80 | 25.00 | 53.150 | 4.500 | 4.500 | 0.1500 | 0.5000 | 0.5000 |
| Ex. 36 | 117.78 | 2.400 | ○ | 10.80 | 10.80 | 25.00 | 49.075 | 4.500 | 4.500 | 0.0750 | 0.5000 | 0.5000 |
| Ex. 37 | 132.78 | 2.400 | ◉ | 14.40 | 14.40 | 25.00 | 55.325 | 6.000 | 6.000 | 0.3250 | 0.0000 | 0.0000 |
| Ex. 38 | 133.02 | 2.400 | ◉ | 14.40 | 14.40 | 25.00 | 55.425 | 6.000 | 6.000 | 0.4250 | 0.0000 | 0.0000 |
| Ex. 39 | 133.38 | 2.400 | ◉ | 14.40 | 14.40 | 25.00 | 55.575 | 6.000 | 6.000 | 0.4250 | 0.0000 | 0.0000 |
| Ex. 40 | 133.58 | 2.400 | ◉ | 14.40 | 14.40 | 25.00 | 55.658 | 6.000 | 6.000 | 0.3417 | 0.0000 | 0.0000 |
| Ex. 41 | 133.98 | 2.400 | ◉ | 14.40 | 14.40 | 25.00 | 55.825 | 6.000 | 6.000 | 0.1750 | 0.0000 | 0.0000 |
| Ex. 42 | 134.36 | 2.400 | ◉ | 14.40 | 14.40 | 25.00 | 55.983 | 6.000 | 6.000 | 0.0167 | 0.0000 | 0.0000 |
| Ex. 43 | 135.42 | 2.400 | ◉ | 14.40 | 14.40 | 25.00 | 56.425 | 6.000 | 6.000 | 0.4250 | 0.0000 | 0.0000 |
| Ex. 44 | 135.78 | 2.400 | ◉ | 14.40 | 14.40 | 25.00 | 56.575 | 6.000 | 6.000 | 0.4250 | 0.0000 | 0.0000 |
| Ex. 45 | 135.94 | 2.400 | ◉ | 14.40 | 14.40 | 25.00 | 56.642 | 6.000 | 6.000 | 0.3583 | 0.0000 | 0.0000 |
| Ex. 46 | 135.98 | 2.400 | ◉ | 14.40 | 14.40 | 25.00 | 56.658 | 6.000 | 6.000 | 0.3417 | 0.0000 | 0.0000 |
| Ex. 47 | 136.26 | 2.400 | ◉ | 14.40 | 14.40 | 25.00 | 56.775 | 6.000 | 6.000 | 0.2250 | 0.0000 | 0.0000 |
| Ex. 48 | 136.46 | 2.400 | ◉ | 14.40 | 14.40 | 25.00 | 56.858 | 6.000 | 6.000 | 0.1417 | 0.0000 | 0.0000 |
| Ex. 49 | 136.78 | 2.400 | ◉ | 14.40 | 14.40 | 25.00 | 56.992 | 6.000 | 6.000 | 0.0083 | 0.0000 | 0.0000 |
| Ex. 50 | 137.00 | 2.400 | ◉ | 14.40 | 14.40 | 25.00 | 57.083 | 6.000 | 6.000 | 0.0833 | 0.0000 | 0.0000 |

Figure 4:
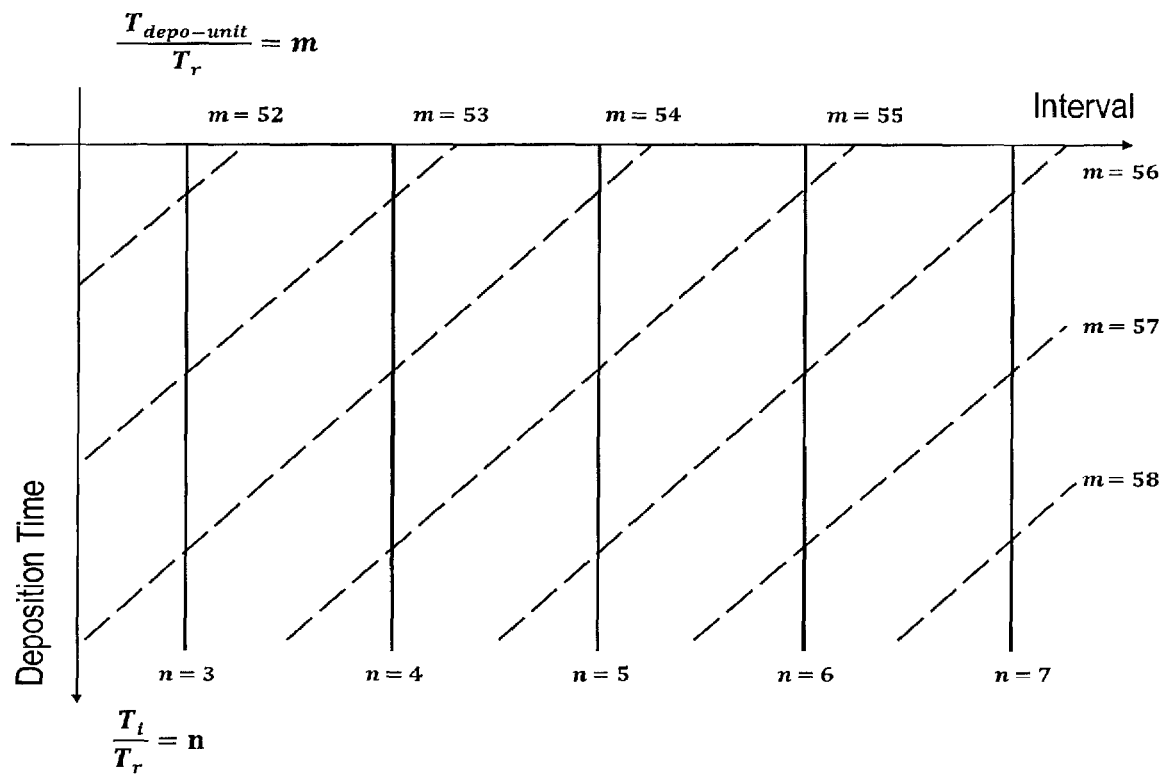
FIG. 4 is a view in which specific positions of solid lines and broken lines in FIG. 2, which correspond to the deposition conditions in Examples and Comparative Examples of the present invention, are indicated with integers m and n.

In FIG. 4, regions of deposition conditions in Examples and Comparative Examples shown in the aforementioned Table 1 are applied to FIG. 2.

All of Comparative Examples 1 to 12 do not satisfy the condition (1), in which the absolute value of the difference from the closest integer to $(T_{depo\text{-}unit}/T_r)$ is more than 0.02. Comparative Examples 1 to 12, in which the difference from the closest integer to $(T_{i1}/T_r)$ or $(T_{i2}/T_r)$ is more than 0.02, do not satisfy the condition (2), either. The evaluation result of the in-plane distribution of the centroid wavelength in each of Comparative Examples 1 to 12 is ×.

Each of Examples 1 to 36 satisfies the condition (1), in which the absolute value of the difference from the closest integer to $(T_{depo\text{-}unit}/T_r)$ is more than 0.02. The evaluation result of the in-plane distribution of the centroid wavelength in each of Examples 1 to 36 is Δ or ○.

Examples 42 and 49, in which the absolute value of the difference from the closest integer to $(T_{depo\text{-}unit}/T_r)$ is 0.02 or less, do not satisfy the condition (1). On the other hand, Examples 42 and 49, in which the difference from the closest integer to $(T_{i1}/T_r)$ or $(T_{i2}/T_r)$ is zero, thus satisfy the condition (2). The evaluation result of the in-plane distribution of the centroid wavelength in each of Examples 42 and 49 is ◉.

Examples 37 to 41, 43 to 48 and 50, in which the absolute value of the difference from the closest integer to $(T_{depo\text{-}unit}/T_r)$ is more than 0.02, thus satisfy the condition (1). In addition, since the difference from the closest integer to $(T_{i1}/T_r)$ or $(T_{i2}/T_r)$ is zero, they also satisfy the condition (2). The evaluation result of the in-plane distribution of the centroid wavelength in each of Examples 37 to 41, 43 to 48 and 50 is ◉.

While the present invention has been described in detail and with reference to specific embodiments thereof, it will be apparent to one skilled in the art that various changes and modifications can be made therein without departing from the spirit and scope of the present invention.

The present application is based on a Japanese patent application No. 2016-166751 filed on Aug. 29, 2016, the content thereof being incorporated herein by reference.

The invention claimed is:

1. A method for manufacturing a multilayer film-deposited substrate comprising a substrate and a multilayer film containing a plurality of lamination units and provided on the substrate, the method comprising:

stacking the plurality of lamination units on the substrate while rotating the substrate around a rotational axis perpendicular to a substrate surface thereof, in which each of the lamination units has a plurality of layers formed by a dry deposition process, wherein:

when a plurality of the multilayer film-deposited substrates are manufactured by using the dry deposition process, a deposition is performed only under a condition satisfying at least one of the following requirements (1) and (2), thereby obtaining the multilayer film-deposited substrate having an in-plane distribution in a total film thickness of the multilayer film of 0.2% or less:

$$T_{depo\text{-}unit}/T_r < (m-0.02) \text{ or } (m+0.02) < T_{depo\text{-}unit}/T_r \quad (1)$$

$$(n-0.02) \leq T_i/T_r \leq (n+0.02) \quad (2)$$

where m and n are independently any integer, $T_i$ is a time interval between the depositions among each layer of the plurality of layers included in the lamination unit, $T_{depo\text{-}unit}$ ($=T_{depo\text{-}total}+T_{i\text{-}total}$) is a deposition unit time required for depositing the one lamination unit, where $T_{depo\text{-}total}$ is a total deposition time of the plurality of layers included in the lamination unit and $T_{i\text{-}total}$ is a total of the time intervals $T_i$'s, and $T_r$ is a rotation period of the substrate.

2. The method for manufacturing the multilayer film-deposited substrate according to claim 1, wherein the multilayer film-deposited substrate has an in-plane distribution in a total film thickness of the multilayer film being 0.14% or less.

3. The method for manufacturing the multilayer film-deposited substrate according to claim 1, wherein the multilayer film is a multilayer reflective film obtained by stacking a plurality of the lamination units, wherein each of the lamination units has a high refractive layer-low refractive layer structure, or each of the lamination units has a low refractive layer-high refractive layer structure.

4. The method for manufacturing the multilayer film-deposited substrate according to claim 3, wherein the multilayer reflective film has an in-plane distribution of a centroid wavelength of an EUV reflected light being 0.030 nm or less.

5. The method for manufacturing the multilayer film-deposited substrate according to claim 3, further comprising forming a protective layer for the multilayer reflective film on the multilayer reflective film.

6. The method for manufacturing the multilayer film-deposited substrate according to claim 3, further comprising forming an absorption layer that absorbs an EUV light, on the multilayer reflective film or on a protective layer for the multilayer reflective film.

7. The method for manufacturing the multilayer film-deposited substrate according to claim 6, further comprising forming a low reflection layer having a low reflection with regard to an inspection light for use in an inspection of a mask pattern, on the absorption layer.

8. The method for manufacturing the multilayer film-deposited substrate according to claim 1, wherein the deposition is performed in a condition satisfying the requirement (2).

9. The method for manufacturing the multilayer film-deposited substrate according to claim 1, wherein the time interval $T_i$ between the depositions among the each layer is controlled to satisfy at least one of the requirements (1) and (2).

10. The method for manufacturing the multilayer film-deposited substrate according to claim 1, wherein the rotation period of the substrate $T_r$ is controlled to satisfy at least one of the requirements (1) and (2).

11. The method for manufacturing the multilayer film-deposited substrate according to claim 1, wherein the deposition unit time $T_{depo\text{-}unit}$ required for depositing the one lamination unit is controlled to satisfy the requirement (1).

* * * * *